(12) United States Patent
Joe

(10) Patent No.: US 10,073,146 B2
(45) Date of Patent: Sep. 11, 2018

(54) APPARATUS FOR ESTIMATING VOLTAGE OF HYBRID SECONDARY BATTERY AND METHOD THEREOF

(71) Applicant: LG CHEM, LTD., Seoul (KR)

(72) Inventor: Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 195 days.

(21) Appl. No.: 15/027,459

(22) PCT Filed: Oct. 14, 2014

(86) PCT No.: PCT/KR2014/009645
§ 371 (c)(1),
(2) Date: Apr. 6, 2016

(87) PCT Pub. No.: WO2015/056962
PCT Pub. Date: Apr. 23, 2015

(65) Prior Publication Data
US 2016/0245871 A1    Aug. 25, 2016

(30) Foreign Application Priority Data

Oct. 14, 2013 (KR) .................. 10-2013-0122272
Oct. 13, 2014 (KR) .................. 10-2014-0137724

(51) Int. Cl.
G01R 31/36    (2006.01)
H01M 10/48    (2006.01)
(Continued)

(52) U.S. Cl.
CPC ..... G01R 31/3624 (2013.01); G01R 31/3651 (2013.01); H01M 10/4207 (2013.01);
(Continued)

(58) Field of Classification Search
CPC ............ G01R 31/3651; G01R 31/3662; G01R 31/3624; H01M 10/4207; H01M 10/48; H01M 16/00
See application file for complete search history.

(56) References Cited

U.S. PATENT DOCUMENTS 3,997,888 A * 12/1976 Kremer .................. G01R 17/10
                                                    320/136
7,449,896 B2 * 11/2008 Ochi .................. G01R 19/0092
                                                    324/713
(Continued)

FOREIGN PATENT DOCUMENTS

JP    2008-260346 A    10/2008
JP    2012-057998 A    3/2012
(Continued)

OTHER PUBLICATIONS

Plett et al., Simulating Battery Packs Comprising Parallel Cell Modules and Series Cell Modules, EVS24 International Battery, Hybrid and Fuel Cell Electric Vehicle Symposium, May 16, 2009.*
(Continued)

*Primary Examiner* — Kyle R Quigley
(74) *Attorney, Agent, or Firm* — Birch, Stewart, Kolasch & Birch, LLP

(57) ABSTRACT

An apparatus and a method for estimating voltage of a hybrid secondary battery are provided, in which the hybrid secondary battery includes a first secondary battery and a second secondary battery having different electrochemical characteristics from each other and being connected in parallel with each other. The apparatus includes a sensor unit which measures an operating current of the hybrid secondary battery, and a control unit which estimates the voltage of the hybrid secondary battery using the operating current, and a voltage equation derived from a circuit model including a first circuit unit which simulates a voltage variation of the (Continued)

first secondary battery by a first open-circuit voltage element and optionally, a first impedance element, and a second circuit unit which is connected in parallel with the first circuit unit and simulates a voltage variation of the second secondary battery by a second open-circuit voltage element and optionally, a second impedance element.

17 Claims, 4 Drawing Sheets

(51) Int. Cl.
    *H01M 10/42* (2006.01)
    *H01M 16/00* (2006.01)
(52) U.S. Cl.
    CPC ........... *H01M 10/48* (2013.01); *H01M 16/00* (2013.01); *G01R 31/3662* (2013.01)

(56) References Cited

U.S. PATENT DOCUMENTS

| | | | |
|---|---|---|---|
| 2004/0006440 A1* | 1/2004 | Kim | G01R 31/3651 702/63 |
| 2009/0261837 A1 | 10/2009 | Plett | |
| 2011/0257914 A1 | 10/2011 | Tsuchiya | |
| 2013/0110429 A1 | 5/2013 | Mitsuyama et al. | |
| 2013/0158916 A1 | 6/2013 | Baruzzi et al. | |

FOREIGN PATENT DOCUMENTS

| | | |
|---|---|---|
| KR | 10-2004-0003336 A | 1/2004 |
| KR | 10-2008-0041702 A | 5/2008 |
| KR | 10-0996693 B1 | 11/2010 |

OTHER PUBLICATIONS

Rausch et al., "Nonlinear Observability and Identifiability of Single Cells in Battery Packs," 2013 IEEE International Conference on Control Applications (CCA) Part of 2013 IEEE Multi-Conference on Systems and Control, Hyderabad, India, Aug. 28-30, 2013, pp. 401-406.

Zhang et al., "Modeling Discharge Behavior of Multicell Battery," IEEE Transactions on Energy Conversion, vol. 25, No. 4, Dec. 2010 (Jun. 14, 2010, first published Nov. 19, 2010), pp. 1133-1141.

International Search Report issued in PCT/KR2014/009645 dated Jan. 12, 2015.

\* cited by examiner

APPARATUS FOR ESTIMATING VOLTAGE OF HYBRID SECONDARY BATTERY AND METHOD THEREOF

TECHNICAL FIELD

The present disclosure relates to an apparatus and a method for estimating voltage of a hybrid secondary battery.

The present application claims the benefit of Korean Patent Application No. 10-2013-0122272 filed on Oct. 14, 2013 with the Korean Intellectual Property Office, the disclosure of which is incorporated herein by reference in its entirety. Additionally, the present application claims the benefit of Korean Patent Application No. 10-2014-0137724 filed on Oct. 13, 2014 with the Korean Intellectual Property Office, the disclosure of which is incorporated herein by reference in its entirety.

BACKGROUND ART

Batteries, which generate electrical energy by way of electrochemical oxidation and reduction, are used over a wide range of applications. For example, the batteries are used in gradually expanding fields, including: devices carried around in user's hands, such as portable phones, laptop computers, digital cameras, video cameras, tablet computers, electrically-driven tools, and so on; electrically-driven power apparatuses such as electric bicycles, electric autobicycles, electric vehicles, hybrid vehicles, electric boats, electric airplanes, and so on; power storage apparatuses for use in storing electricity generated from renewable energy or surplus generated electricity; or uninterruptable power supply to stably supply electricity to a variety of information communication apparatuses including server computers, base stations for communication, and so on.

The battery includes three basic elements which are: a negative electrode containing a material that undergoes oxidation and releases electrons during discharging; a positive electrode containing a material that undergoes reduction and accepts electrons during discharging; and an electrolyte that allows migration of operating ions between the negative electrode and the positive electrode.

The battery can be categorized into a primary battery which is not reusable once it is discharged, and a secondary battery which has at least partially reversible electrochemical reaction, thus are repetitively chargeable and dischargeable.

For the secondary battery, lead-acid battery, nickel-cadmium battery, nickel-zinc battery, nickel-iron battery, silver oxide battery, nickel metal hydride battery, zinc-manganese oxide battery, zinc-bromide battery, metal-air battery, lithium secondary battery, and so on, are known.

Among these, the lithium secondary battery is attracting greatest commercial attentions, in view of its relatively higher energy density, higher battery voltage and longer storage life than the other secondary batteries.

Concerning the secondary battery, materials used for positive electrode material and negative electrode material have critical influence on the performance of the secondary battery. Accordingly, a variety of efforts are being made to provide the positive electrode material and the negative electrode material which have stability at high temperature and can provide high energy capacity and low manufacture cost.

However, it will not be easy to develop a positive electrode material and a negative electrode material that have superior performances in all aspects. Therefore, attempts are recently made to make up for the shortcomings of respective secondary batteries by way of connecting in parallel the secondary batteries that include different types of positive electrode materials and negative electrode materials from each other.

Hereinafter, the secondary battery formed by connecting different types of secondary batteries in parallel will be referred to as a 'hybrid secondary battery'.

Meanwhile, the hybrid secondary battery often has a voltage profile that includes a point of inflection, when the constituent batteries have different operating voltage ranges from one another. This is because, when the constituent batteries have different operating voltage ranges, dominant reaction kinetics will change during charging or discharging of the hybrid secondary battery.

When the voltage profile of the hybrid secondary battery has a point of inflection, the voltage variation near the point of inflection is relatively smaller compared to state of charge (SOC) variation. That is, voltage seldom changes even when the state of charge considerably changes. Meanwhile, voltage measured by a sensor has an error due to sensor error, dynamically-changing polarization voltage, and so on. Accordingly, it is hard to ensure accuracy when a hybrid secondary battery is controlled by directly using the measured voltage near the point of inflection. This is because, near the point of inflection, a general battery control system estimates a considerable change in the electrochemical state of a battery, even with a slight variation in the measured voltage.

Accordingly, a method is necessary for a hybrid secondary battery, which can indirectly estimate the voltage using other measurable parameters, instead of directly measuring the voltage.

DISCLOSURE

Technical Problem

The present disclosure is designed to solve the problems of the related art, and therefore the present disclosure is directed to providing an apparatus and a method for indirectly estimating voltage of a hybrid secondary battery in which secondary batteries of different electrochemical characteristics from each other are connected in parallel, by using iterative algorithm, instead of directly measuring the voltage.

Technical Solution

In one aspect of the present disclosure, there is provided an apparatus for estimating voltage of a hybrid secondary battery, which estimates the voltage of the hybrid secondary battery including a first secondary battery and a second secondary battery having different electrochemical characteristics from each other and being connected in parallel with each other. The apparatus includes a sensor unit which measures operating current of the hybrid secondary battery, and a control unit which estimates the voltage of the hybrid secondary battery by using a voltage equation derived from a pre-defined circuit model, and the operating current.

According to one aspect, the first secondary battery and the second secondary battery are batteries independent from each other, and may be packaged in different packing materials from each other, or packaged together in a single packing material.

In the latter case, the first secondary battery and the second secondary battery may each be configured as a unit cell including a positive plate and a negative plate, and a separator interposed therebetween. The first secondary battery and the second secondary battery may include coating layers of active materials having different electrochemical characteristics, on the positive plate and/or the negative plate.

According to another aspect, the first secondary battery and the second secondary battery may each include a plurality of unit cells, or a plurality of battery modules, connected in series and/or in parallel.

Preferably, the circuit model may include a first circuit unit which simulates voltage variation of the first secondary battery by a first open-circuit voltage element of the first secondary battery, and optionally, a first impedance element, and a second circuit unit which is connected in parallel with the first circuit unit and simulates the voltage variation of the second secondary battery by a second open-circuit voltage element of the second secondary battery, and optionally, a second impedance element.

Preferably, the first open-circuit voltage formed by the first open-circuit voltage element may be determined based on a pre-defined correlation between a first state of charge of the first secondary battery and the first open-circuit voltage.

Similarly, the second open-circuit voltage formed by the second open-circuit voltage element may be determined based on a pre-defined correlation between a second state of charge of the second secondary battery and the second open-circuit voltage.

For reference, the state of charge is known in the art as the State of Charge (SOC) parameter. The values of the state of charge may be expressed by quantitative representation with parameters SOC and z. The state of charge can be expressed with the parameter SOC as percentage (0 to 100%), and can be expressed with parameter z as a number (0 to 1). The state of charge may be measured with, without limitation, ampere counting method.

Preferably, the pre-defined correlation may be obtained from an open-circuit voltage profile measured according to the variation in state of charge.

According to one aspect, the pre-defined correlation may be a look-up table which may map the open-circuit voltage corresponding to each state of charge.

The look-up table may be obtained by using open-circuit voltage data which is measured per state of charge regarding the first and the second secondary batteries. The open-circuit voltage data may be obtained by experiment.

According to another aspect, the pre-defined correlation may be a look-up function which may include the state of charge and the open-circuit voltage as an input parameter and an output parameter, respectively.

The look-up function may be obtained by the numerical analysis of coordinate data which constructs the open-circuit voltage profile measured per state of charge regarding the first and the second secondary batteries.

Preferably, the first impedance element and the second impedance element may each include at least one circuit element to simulate IR voltage and/or polarization voltage which may be generated when the first secondary battery and the second secondary battery are operated.

The 'IR voltage' as used herein refers to voltage generated by internal resistance of the secondary battery during the secondary battery charging or discharging.

Due to IR voltage, the voltage of the secondary battery is higher than the open-circuit voltage during secondary battery charging, and is lower during secondary battery discharging.

According to one aspect, the first and/or second impedance element may include at least one resistor, at least one capacitor, at least one inductor, or a combination thereof.

According to another aspect, the first and/or second impedance element may include an RC circuit in which the resistor and the capacitor are connected in parallel, and a resistor connected in series thereto.

According to yet another aspect, the first and/or second impedance element may include a plurality of RC circuits composed of resistors and capacitors connected in parallel. The plurality of RC circuits may be connected in series and/or in parallel.

Preferably, the first open-circuit voltage component and the first impedance element may be connected in series. Similarly, the second open-circuit voltage component and the second impedance element may be connected in series.

Preferably, the control unit may determine a first impedance voltage formed by the first impedance element, using a first impedance voltage equation derived from connection relation and electrical characteristic values of the circuit elements included in the first impedance element.

Similarly, the control unit may determine a second impedance voltage formed by the second impedance element, using a second impedance voltage equation derived from connection relation and electrical characteristic values of the circuit elements included in the second impedance element.

Here, the electrical characteristic value of each of the circuit elements may be determined based on a type of the corresponding circuit element, and this may be any one of a resistance value, a capacitance value and an inductance value.

According to the present disclosure, the operating current equals to a sum of a first current flowing through the first circuit unit and a second current flowing through the second circuit unit.

Preferably, the control unit may determine the first current and the second current, respectively, by using a first current distribution equation and a second current distribution equation derived from the circuit model.

Preferably, the first current equation may include, as input parameters, the first and the second open-circuit voltages, the first and the second impedance voltages, and the operating current. Similarly, the second current equation may include, as input parameters, the first and the second open-circuit voltages, the first and the second impedance voltages, and the operating current.

According to one aspect, when the first impedance element includes a series resistor, the first impedance voltage may be determined by the voltage which is formed by the circuit elements except the series resistor.

Similarly, when the second impedance element includes a series resistor, the second impedance voltage may be determined by the voltage which is formed by the circuit elements except the series resistor.

Preferably, the control unit may time-update the first state of charge by adding up the first current according to time. Similarly, the control unit may time-update the second state of charge by adding up the second current according to time.

The control unit may be a battery management system (BMS) which may be electrically coupled with the secondary battery, or a control element included in the BMS.

The battery management system described above may refer to a system that is called BMS in the technical field pertinent to the present disclosure, but from the perspective of functions, the battery management system may include in its scope any system as long as the system performs at least one function as described herein.

The battery management system may include the circuit model as a software algorithm implementable by a processor. In one example, the circuit model may be written as program codes and stored in a memory device, and implemented by the processor.

The technical objectives of the present disclosure as described above may also be achieved by a method for estimating voltage of a hybrid secondary battery.

According to one aspect, the method for estimating voltage of the hybrid secondary battery estimates the voltage of the hybrid secondary battery which includes a first secondary battery and a second secondary battery having different electrochemical characteristics from each other and being connected in parallel with each other, and may include measuring an operating current of the hybrid secondary battery, determining a first current and a second current respectively flowing through the first circuit unit and the second circuit unit, based on a first and a second current distribution equations derived from the circuit model, time-updating a first state of charge of the first secondary battery and a second state of charge of the second secondary battery by adding up the first current and the second current, determining a first open-circuit voltage and a second open-circuit voltage respectively corresponding to the first state of charge and the second state of charge, time-updating a first impedance voltage formed by a first impedance element included in the first circuit unit by using the first current, time-updating a second impedance voltage formed by a second impedance element included in the second circuit unit by using the second current, and estimating the voltage of the hybrid secondary battery by using the determined first and second open-circuit voltages and the time-updated first and second impedance voltages, and the operating current.

The technical objects of the present disclosure may also be achieved by a computer-readable recording medium recording therein program codes of a method for estimating voltage of a hybrid secondary battery according to the present disclosure.

Advantageous Effects

The present disclosure gives the following effects. According to one aspect of the present disclosure, the voltage of a hybrid secondary battery can be estimated with convenience, using a voltage equation derived from a circuit model and an operating current.

According to another aspect of the present disclosure, the voltage of the hybrid secondary battery having a voltage profile including a point of inflection can be estimated with accuracy, even in a state of charge range particularly near the point of inflection.

According to yet another aspect of the present disclosure, since the voltage of the hybrid secondary battery can be estimated with reliability, it is possible to provide a hybrid secondary battery with optimum combination of secondary batteries that suits the purpose of use.

According to yet another aspect of the present disclosure, it is possible to provide a secondary battery which can satisfy a variety of specifications as required by emerging application fields including electric vehicles, power storage apparatuses, and so on.

DESCRIPTION OF DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, and not intended to limit the scope of the disclosure, so it should be understood that other equivalents and modifications could be made thereto without departing from the spirit and scope of the disclosure.

Figure 1:
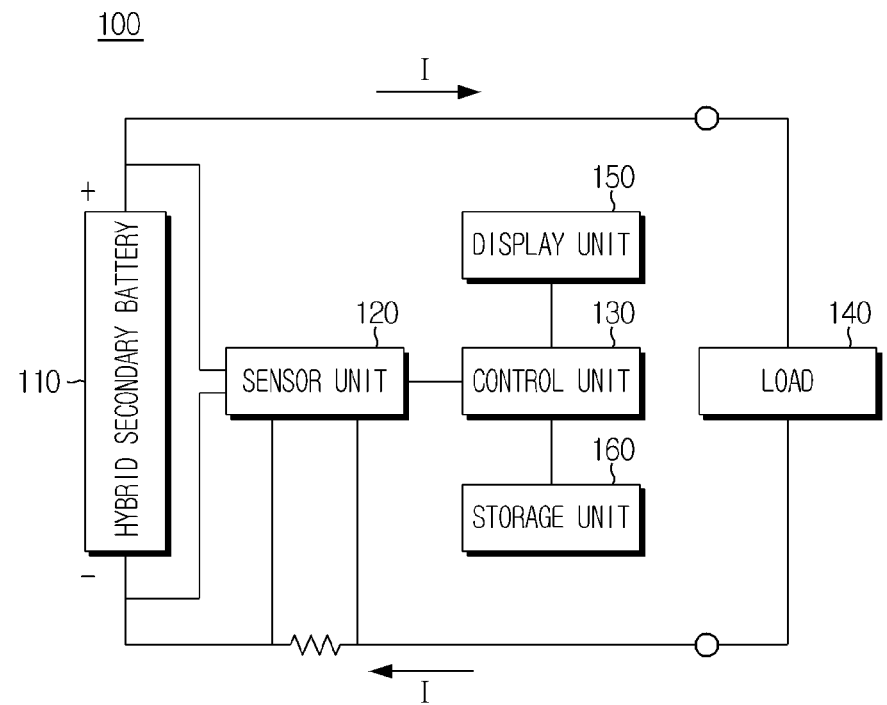
FIG. 1 is a block diagram schematically illustrating, a configuration of an apparatus for estimating a voltage of a hybrid secondary battery according to an embodiment of the present disclosure.

FIG. 1 is a block diagram schematically illustrating a configuration of an apparatus 100 for estimating a voltage of a hybrid secondary battery according to an embodiment of the present disclosure.

As illustrated in the drawing, the apparatus 100 includes a sensor unit 120 and a control unit 130, and is electrically connected with the hybrid secondary battery 110 to estimate the voltage of the hybrid secondary battery 110.

The hybrid secondary battery 110 includes at least a first secondary battery and a second secondary battery which are connected in parallel with each other and have different electrochemical characteristics from each other.

The 'electrochemical characteristic' as used herein refers to at least one of battery capacity, battery use voltage range, maximum/minimum battery charge rate or maximum/minimum battery discharge rate according to state of charge, low rate discharge characteristic, high rate discharge characteristic, temperature-based maximum/minimum charge rate or maximum/minimum discharge rate, charge or discharge profile, resistance profile according to state of charge variation, open-circuit voltage profile according to state of charge variation, and dQ/dV distribution representing capacity characteristic of battery with respect to voltage.

Preferably, the first and the second secondary batteries may be lithium secondary batteries which have electrochemical reaction by the lithium ions. In this example, the first and the second secondary batteries may be different in at least one of a positive electrode material, a negative electrode material, and an electrolyte.

According to one embodiment, the first secondary battery may include, as a positive electrode material, an alkali metal compound expressed by general chemical formula $A[A_xM_y]O_{2+z}$ (where, A includes at least one or more elements selected from among Li, Na and K; M includes at least one or more elements selected from among Ni, Co, Mn, Ca, Mg, Al, Ti, Si, Fe, Mo, V, Zr, Zn, Cu, Al, Mo, Sc, Zr, Ru, and Cr; $x \geq 0$, $1 \leq x+y \leq 2$, $-0.1 \leq z \leq 2$; and x, y, z and stoichiometric coefficients of components contained in M are so selected that the compound maintains electric neutrality).

Alternatively, the first secondary battery may include, as the positive electrode material, the alkali metal compound $xLiM^1O_2\text{-}(1-x)Li_2M^2O_3$ (where, $M^1$ includes at least one or more elements having a mean oxidation state of 3; $M^2$ includes at least one or more elements having a mean oxidation state of 4; and $0 \leq x \leq 1$), as disclosed in U.S. Pat. Nos. 6,677,082, 6,680,143, and so on.

Further, the second secondary battery may include, as the positive electrode material, lithium metal phosphate expressed by general chemical formula $Li_aM^1_xFe_{1-x}M^2_yP_{1-y}M^3_zO_{4-z}$ (where $M^1$ includes at least one or more elements selected from among Ti, Si, Mn, Co, Fe, V, Cr, Mo, Ni, Nd, Mg and Al; $M^2$ includes at least one or more elements selected from among Ti, Si, Mn, Co, Fe, V, Cr, Mo, Ni, Nd, Mg, Al, As, Sb, Si, Ge, V and S; $M^3$ includes one element selected from a halogen group optionally including F; $0<a\leq 2$, $0\leq x\leq 1$, $0\leq y<1$, $0\leq z<1$; and a, x, y, z, and stoichiometric coefficient of components contained in $M^1$, $M^2$, and $M^3$ are so selected that the compound maintains electric neutrality), or $Li_3M_2(PO_4)_3$ [where, M includes at least one or more elements selected from among Ti, Si, Mn, Fe, Co, V, Cr, Mo, Ni, Mg and Al].

Optionally, the positive electrode material included in the first and/or the second secondary batteries may include a coating layer. The coating layer may include a carbon layer, or may include an oxide layer or a fluoride layer including at least one or more elements selected from the group consisting of Ti, Si, Mn, Co, Fe, V, Cr, Mo, Ni, Nd, Mg, Al, As, Sb, Si, Ge, V and S.

Further, the first and the second secondary batteries may include different types of negative electrode materials in the negative electrode, thereby to have different electrochemical characteristics from each other. The negative electrode material may include carbonaceous material, lithium metal, silicon or tin, or a metal oxide such as $TiO_2$, $SnO_2$ having electric potential of less than 2 V. For the carbonaceous material, either the low-crystalline carbon or the high-crystalline carbon may be used. The representative example of the low-crystalline carbon includes soft carbon and hard carbon, and the representative example of the high-crystalline carbon includes high temperature sintered carbon such as natural graphite, artificial graphite, Kish graphite, pyrolytic carbon, mesophase pitch based carbon fiber, mesocarbon microbeads, mesophase pitches, petroleum-derived cokes, tar pitch-derived cokes, and so on.

Further, the first and/or the second secondary batteries may include different types of electrolytes, thereby to have different electrochemical characteristics from each other, and the electrolyte may include salt with a structure such as $A^+B^-$. In the above structure, $A^+$ includes alkali metal cation such as $Li^+$, $Na^+$, $K^+$, or ions consisting of a combination thereof. $B^-$ includes one or more anion selected from the group consisting of $F^-$, $Cl^-$, $Br^-$, $I^-$, $NO_3^-$, $N(CN)_2^-$, $BF_4^-$, $ClO_4^-$, $AlO_4^-$, $AlCl_4^-$, $PF_6^-$, $SbF_6^-$, $AsF_6^-$, $BF_2C_2O_4^-$, $BC_4O_8^-$, $(CF_3)_2PF_4^-$, $(CF_3)_3PF_3^-$, $(CF_3)_4PF_2^-$, $(CF_3)_5PF^-$, $(CF_3)_6P^-$, $CF_3SO_3^-$, $C_4F_9SO_3^-$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH^-$, $(SF_5)_3C^-$, $(CF_3SO_2)_3C^-$, $CF_3(CF_2)_7SO_3^-$, $CF_3CO_2^-$, $CH_3CO_2^-$, $SCN^-$ and $(CF_3CF_2SO_2)_2N^-$.

Further, the electrolyte may include organic solvent. For the organic solvent, propylene carbonate (PC), ethylenecarbonate (EC), diethyl carbonate (DEC), dimethyl carbonate (DMC), dipropyl carbonate (DPC), dimethyl sulfoxide, acetonitrile, dimethoxyethane, diethoxyethane, tetrahydrofuran, N-methyl-2-pyrrolidone (NMP), ethyl methyl carbonate (EMC), γ-butyrolactone or a mixture thereof may be used.

According to the present disclosure, as long as the first secondary battery and the second secondary battery have different electrochemical characteristics and are connected in parallel with each other, the configuration thereof is not limited to a package form of the respective secondary batteries, and the number of unit cells of the respective secondary batteries.

Further, the first secondary battery and the second secondary battery will have to be understood as a concept that encompasses even an assembly of a plurality of battery elements, so that each of the first secondary battery and the second secondary battery includes a unit cell, a module including a plurality of unit cells, a pack including a plurality of modules, and so on.

Figure 2:
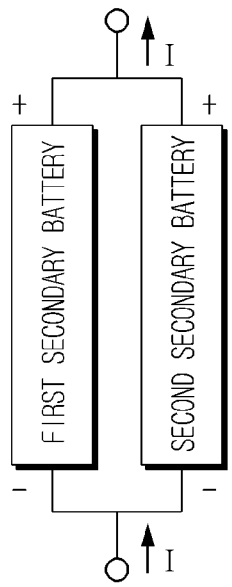
FIG. 2 is a conceptual diagram illustrating an example in which a first secondary battery and a second secondary battery independently packaged in different packages from each other are connected in parallel.
Figure 3:
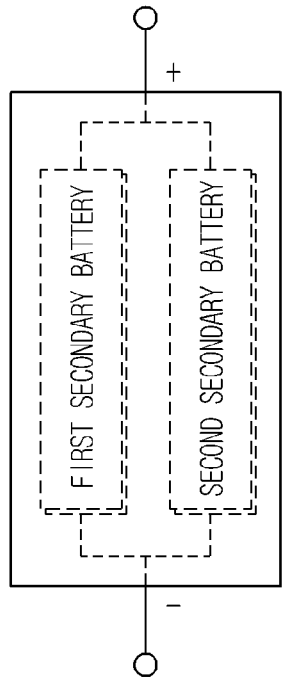
FIG. 3 is a conceptual diagram illustrating an example in which a first secondary battery and a second secondary battery are packaged in one package and connected in parallel therein.

According to one aspect, the first secondary battery and the second secondary battery are batteries independent from each other, and may be packaged in different packages as shown in FIG. 2, or packaged together in a single package as shown in FIG. 3.

In one example, the first and the second secondary batteries may be different types of lithium secondary batteries independently packaged in different flexible pouch packaging films. Alternatively, the first and the second secondary batteries may be different types of lithium secondary batteries packaged together in one pouch packaging film.

Further, when different types of first and second unit cells are stacked alternately and connected in parallel in one package, the first unit cell group and the second unit cell groups in alternate stack may be considered as corresponding to the first secondary battery and the second secondary battery, respectively.

The first unit cell and the second unit cell each include, at least, a positive plate and a negative plate, and a separator interposed therebetween. The first unit cell and the second unit cell have different electrochemical characteristics. Accordingly, the positive plates and the negative plates of the first unit cell and the second unit cell may include coating layers of different active materials from each other.

According to another aspect, the first secondary battery and the second secondary battery each may include at least one unit cell including a negative electrode/a separator/a positive electrode as a minimum unit, or an assembly of unit cells in which at least two or more unit cells are connected in series and/or in parallel and stacked.

According to yet another aspect, the first secondary battery may include a secondary battery module in which a plurality of secondary batteries each having a first electrochemical characteristic and being packaged individually are connected in series and/or in parallel. Similarly, the second secondary battery may include a secondary battery module in which a plurality of secondary batteries each having a second electrochemical characteristic and being packaged individually are connected in series and/or in parallel.

The secondary battery 110 may be electrically connected with a load 140. The load 140 is included in the variety of electrically-driven apparatuses, and it refers to an energy consuming device included in the electrically-driven apparatuses operating based on electrical energy supplied during discharging of the secondary battery 110.

The electrically-driven apparatuses may be, for example: an electrically-driven moving apparatus such as electric vehicle (EV), hybrid electric vehicle (HEV), plug-in hybrid electric vehicle (PHEV) or E-bike; a hand-held device such as mobile phone, smartphone or smart pad; a movable computer such as laptop computer; a movable image photographing device such as camcorder or digital camera; or a large-capacity energy storage system (ESS) for use at power grid or uninterrupted power supply, but not limited thereto.

The load may be, without limitation, a rotary power device such as a motor, a power converting device such as an inverter, and so on, although the present disclosure is not limited to a specific type of the load.

Additionally, the apparatus 100 may optionally further include a storage unit 160. The storage unit 160 is not limited to any specific type of storage medium as long as it can record and erase information. In one example, the storage unit 160 may be RAM, ROM, register, hard disk, optical recording medium, or magnetic recording medium. Further, the storage unit 160 may be connected with the control unit 130 via, for example, data bus, and so on, to allow access by the control unit 130. The storage unit 160 stores and/or updates and/or erases and/or transmits program including various control logics implemented by the control unit 130 and/or the data that is generated when the control logic is implemented. The storage unit 160 is logically dividable into two or more, and included in the control unit 130 without limitation.

Additionally, the apparatus 100 may optionally further include a display unit 150. The display unit 150 is not limited to any specific type, as long as it can display information generated by the control unit 130 as graphic interface. In one example, the display unit 150 may be a liquid crystal display, an LED display, an OLED display, an E-INK display, a flexible display, and so on. The display unit 150 may be connected with the control unit 130 directly or indirectly. In the latter case, the display unit 150 may be located at an area physically separated from an area where the control unit 130 is located. Further, a third-party control unit (not illustrated) may be disposed between the display unit 150 and the control unit 130, in which case the third-party control unit may receive from the control unit 130 information to be displayed on the display unit 150 and display the received information on the display unit 150. To this purpose, the third-party control unit and the control unit 130 may be connected via communication interface.

Under the control of the control unit 130, the sensor unit 120 may repeatedly measure the operating current I of the hybrid secondary battery 110 at time intervals and output the measured operating current I to the control unit 130. As used herein, the 'operating current I' refers to charging current or discharging current of the hybrid secondary battery 110.

Optionally, under the control of the control unit 130, the sensor unit 120 may measure the voltage of the hybrid secondary battery 110 and output the measured voltage to the control unit 130. This voltage measurement is performed to set the initial conditions of some of the parameters used in the circuit model, which will be described in detail below.

The sensor unit 120 may include a voltage measuring means and a current measuring means. The voltage measuring means may be configured as a circuit which measures the voltage of the hybrid secondary battery 110 based on a reference electric potential. The current measuring may be configured as a sense resistor which is installed on a line where a charge current or a discharge current flows. However, the present disclosure is not limited to specific configurations of the voltage measuring means and the current measuring means.

The voltage measuring means and the current measuring means may be included in one sensor unit 120, but may be separated from each other physically. In such example, the sensor unit 120 will have to be understood as a concept that includes a voltage measuring means and a current measuring means separated from each other.

The control unit 130 is a constituent element that can implement at least one or more control logics necessary for estimating the voltage of the hybrid secondary battery 110, and in non-limiting example, can estimate the voltage of the hybrid secondary battery 110 using pre-defined circuit model.

In a preferred embodiment, the circuit model may include at least one or more circuit units which are connected in series and/or in parallel to simulate voltage variation of a hybrid secondary battery 110.

Figure 4:
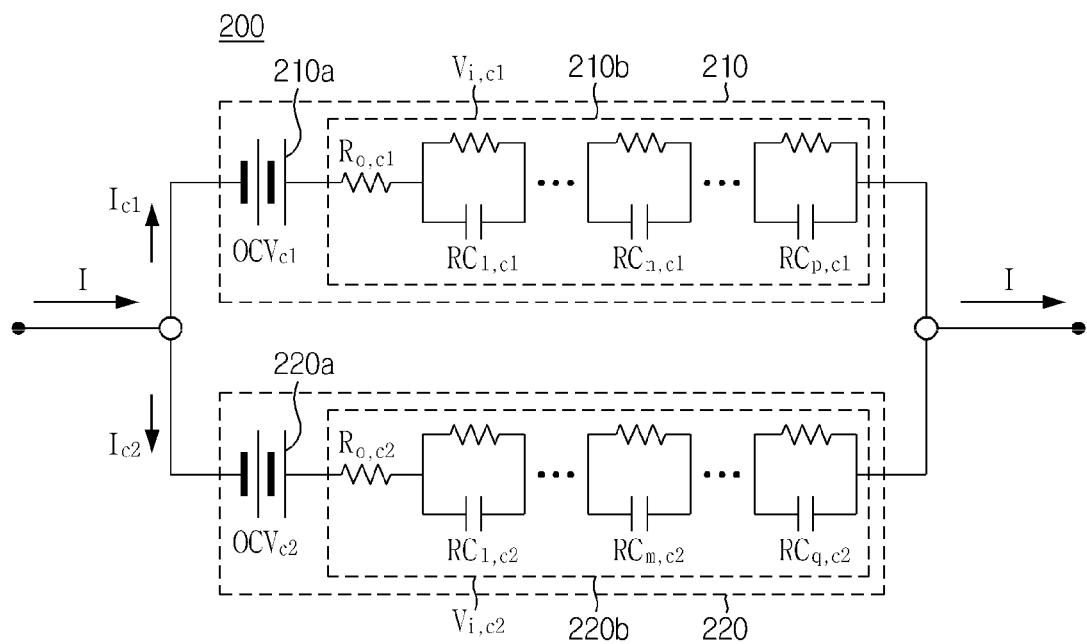
FIG. 4 is a circuit diagram illustrating a circuit model according to an embodiment of the present disclosure.

FIG. 4 is a circuit diagram illustrating a circuit model 200 according to an embodiment of the present disclosure.

Referring to FIG. 4, in order to model the voltage variation of the hybrid secondary battery 110, the circuit model 200 includes a first circuit unit 210 and a second circuit unit 220 connected in parallel.

The first circuit unit 210 is provided to simulate the voltage variation of the first secondary battery, and it includes a first open-circuit voltage element 210a and optionally, a first impedance element 210b, both of which are connected in series.

Similarly, the second circuit unit 220 is provided to simulate the voltage variation of the second secondary battery, and it includes a second open-circuit voltage element 220a and optionally, a second impedance element 220b, both of which are connected in series.

During the hybrid secondary battery 110 charging or discharging, the first open-circuit voltage $OCV_{c1}(z_{c1})$, varying in magnitude by the first state of charge $z_{c1}$ of the first secondary battery, is formed at both ends of the first open-circuit voltage element 210a, and the second open-circuit voltage $OCV_{c2}(z_{c2})$, varying in magnitude by the second state of charge $z_{c2}$ of the second secondary battery, is formed at both ends of the second open-circuit voltage element 220a.

Preferably, the first open-circuit voltage $OCV_{c1}(z_{c1})$ may be determined based on pre-defined correlation between the first state of charge $z_{c1}$ and its corresponding open-circuit voltage of the first secondary battery.

Similarly, the second open-circuit voltage $OCV_{c2}(z_{c2})$ may be determined based on pre-defined correlation between the second state of charge $z_{c2}$ and its corresponding open-circuit voltage of the second secondary battery.

Preferably, the pre-defined correlation may be obtained from an open-circuit voltage profile measured according to the variation in state of charge.

According to one embodiment, the pre-defined correlation may be a look-up table which may map the open-circuit voltage corresponding to each state of charge. Such look-up table may be obtained by using open-circuit voltage data which is measured per state of charge regarding the first and the second secondary batteries. In this example, the open-circuit voltage data may be obtained by experiment.

According to another embodiment, the pre-defined correlation may be a look-up function which may include the state of charge and the open-circuit voltage as an input parameter and an output parameter, respectively. Such look-up function may be obtained by the numeric analysis of coordinate data included in the open-circuit voltage profile which is measured per state of charge regarding the first and the second secondary batteries.

Preferably, the first impedance element 210b and the second impedance element 220b may each include at least one circuit element to simulate IR voltage and/or polarization voltage which are generated during operation of the first secondary battery and the second secondary battery.

The 'IR voltage' as used herein refers to voltage generated by internal resistance of the secondary battery during the secondary battery charging or discharging.

Due to IR voltage, the voltage of the secondary battery is higher than the open-circuit voltage during the secondary battery charging, and is lower during the secondary battery discharging.

The numbers and types of the circuit elements included in the first impedance element 210b and the second impedance element 220b, and connection relation among the circuit elements may be determined according to electrochemical properties of the first secondary battery and the second secondary battery, and preferably, may be determined through the trial and error involving AC impedance measurement test. Further, the electrical characteristic values of the respective circuit elements may be adjusted to optimum values by setting approximate values with the AC impedance measurement test, and then minimizing, by tuning, the error between the voltage estimations according to the present disclosure and the voltage measurements obtained under accurate test conditions.

According to one aspect, the first impedance element 210b and/or the second impedance element 220b may include at least one resistor, at least one capacitor, at least one inductor, or a selective combination thereof. When the first impedance element 210b and/or the second impedance element 220b includes a plurality of circuit elements, the respective circuit elements may be connected with one another in series and/or in parallel.

In a specific embodiment, the first impedance element 210b may include at least one RC circuit $RC_{n,c1}$ composed of a resistor and a capacitor connected in parallel, and a resistor $R_{0,c1}$ connected in series thereto. As used herein, n is an index representing n-th RC circuit.

Similarly, the second impedance element 220b may include at least one RC circuit $RC_{m,c2}$ composed of a resistor and a capacitor connected in parallel, and a resistor $R_{0,c2}$ connected in series thereto. As used herein, m is an index representing m-th RC circuit.

The RC circuits $RC_{n,c1}$, $RC_{m,c2}$ correspond to the circuit elements provided to simulate the polarization voltage which is generated during operation of the first secondary battery and the second secondary battery. The electrical characteristic values and numbers of elements of the resistors and the capacitors included in the RC circuits $RC_{n,c1}$, $RC_{m,c2}$, as well as the number of the RC circuits $RC_{n,c1}$, $RC_{m,c2}$ may vary according to the polarization voltage characteristics of the first secondary battery and the second secondary battery. Further, when the polarization voltages of the first secondary battery and the second secondary battery are negligibly small, the RC circuits $RC_{n,c1}$, $RC_{m,c2}$ may be omitted.

The series resistors $R_{0,c1}$, $R_{0,c2}$ correspond to the circuit elements provided to simulate the IR voltage which is generated during operation of the first secondary battery and the second secondary battery. The electrical characteristic values of the series resistors $R_{0,c1}$, $R_{0,c2}$ may vary according to IR voltage characteristics. Further, the number of the series resistors $R_{0,c1}$, $R_{0,c2}$ may be two or more depending on need. When the IR voltages of the first secondary battery and the second secondary battery are negligibly small, the series resistors $R_{0,c1}$, $R_{0,c2}$ may be omitted.

Preferably, the control unit 130 may determine a first impedance voltage $V_{i,c1}$ formed by the first impedance element 210b, by using a first impedance voltage equation derived from connection relation and electrical characteristic values of the circuit elements included in the first impedance element 210b. Similarly, the control unit 130 may determine a second impedance voltage $V_{i,c2}$ formed by the second impedance element 220b, by using a second impedance voltage equation derived from connection relation and electrical characteristic values of the circuit elements included in the second impedance element 220b. As used herein, the electrical characteristic value of each of the circuit elements may be determined based on a type of the corresponding circuit element, and this may be any one of a resistance value, a capacitance value and an inductance value.

The first impedance voltage $V_{i,c1}$ can be determined based on a sum of voltages that are formed by the series-connected circuit elements included in the first impedance element 210b, and the second impedance voltage $V_{i,c2}$ can be determined based on a sum of voltages that are formed by the series-connected circuit elements included in the second impedance element 220b.

Preferably, when the first impedance element 210b and the second impedance element 220b include series resistors, the voltages formed by the series resistors may not be taken into account in determining the first impedance voltage $V_{i,c1}$ and the second impedance voltage $V_{i,c2}$.

When the first impedance element 210b and/or the second impedance element 220b include at least one or more RC circuits, the voltage formed by each RC circuit may be determined based on the time-discrete equation as Equation (1) below. Since the time-discrete equation below is already well known, a method of deriving the same will not be specifically described herein.

$$V_{RC}[k+1] = \exp\left(-\frac{\Delta t}{RC}\right)V_{RC}[k] + R\left(1 - \exp\left(-\frac{\Delta t}{RC}\right)\right)I_{RC}[k] \quad (1)$$

In Equation (1), k denotes time index, $\Delta t$ denotes time interval between time index k and time index k+1, R and C respectively denote a resistance value of the resistor and a capacitance value of the capacitor included in the RC circuit, and $I_{RC}[k]$ denotes current flowing through the RC circuit.

Meanwhile, the operating current I equals to a sum of the first current $I_{c1}$ flowing through the first circuit unit 210 and a second current $I_{c2}$ flowing through the second circuit unit 220. Accordingly, the relationships between the operating current I and the first current $I_{c1}$ and the second current $I_{c2}$ can be expressed by the time-discrete equation as Equation (2) below.

$$I[k] = I_{c1}[k] + I_{c2}[k] \quad (2)$$

In Equation (2), during the hybrid secondary battery 110 charging, I[k], $I_{c1}[k]$ and $I_{c2}[k]$ have positive values. In contrast, during the hybrid secondary battery 110 discharging, I[k], $I_{c1}[k]$ and $I_{c2}[k]$ have negative values.

The control unit 130 may determine the first current $I_{c1}[k]$ and the second current $I_{c2}[k]$, by using a first current distribution equation and a second current distribution equation derived from the circuit model 200.

The process of deriving the first current distribution equation and the second current distribution equation in a form of a time-discrete equation will be described below.

First, at time index k, the first current and the second current may be expressed by Equations (3) and (4) below.

$$I_{c1}[k] = \frac{V[k] - \left(OCV_{c1}(z_{c1}[k]) + \sum_n V_{RC,c1}^n[k]\right)}{R_{0,c1}} \quad (3)$$

$$I_{c2}[k] = \frac{V[k] - \left(OCV_{c2}(z_{c2}[k]) + \sum_m V_{RC,c2}^m[k]\right)}{R_{0,c1}} \quad (4)$$

In the above equations, V[k] denotes the voltage of the hybrid secondary battery.

$$\sum_n V_{RC,c1}^n[k]$$

denotes a sum of voltages formed by at least one or more RC circuits $RC_{n,c1}$ included in the first circuit unit 210, in which $V_{RC,c1}^n$ denotes voltage formed at the n-th RC circuit. n is a natural number between 1 and p, and minimum value of p is 1. Similarly, $$\sum_m V_{RC,c2}^m[k]$$

denotes a sum of voltages formed by at least one or more RC circuits $RC_{m,c2}$ included in the second circuit unit 220, in which $V_{RC,c2}^m$ denotes the voltage formed at the m-th RC circuit. m is a natural number between 1 and q, and minimum value of q is 1. $z_{c1}[k]$ and $z_{c2}[k]$ denote states of charge of the first secondary battery and the second secondary battery, respectively. $R_{0,c1}$ and $R_{0,c2}$ denote resistance values of the series resistors included in the first circuit unit 210 and the second circuit unit 220, respectively.

By substituting Equations (3) and (4) into Equation (2) and rearranging with respect to the voltage V[k] of the hybrid secondary battery, the voltage equation as Equation (5) below may be obtained.

$$V[k] = \frac{\left(OCV_{c1}(z_{c1}[k]) + \sum_n V_{RC,c1}^n[k]\right)R_{0,c2} + \left(OCV_{c2}(z_{c2}[k]) + \sum_m V_{RC,c2}^m[k]\right)R_{0,c1} + I[k]R_{0,c1}R_{0,c2}}{R_{0,c1} + R_{0,c2}} \quad (5)$$

Next, by substituting Equation (5) into Equations (3) and (4), respectively, the first current distribution equation (6) and the second current distribution equation (7) may be obtained as below.

$$I_{c1}[k] = \frac{\left(OCV_{c2}(z_{c2}[k]) + \sum_m V_{RC,c2}^m[k]\right) - \left(OCV_{c1}(z_{c1}[k]) + \sum_n V_{RC,c1}^n[k]\right) + I[k]R_{0,c2}}{R_{0,c1} + R_{0,c2}} \quad (6)$$

$$I_{c2}[k] = \frac{\left(OCV_{c1}(z_{c1}[k]) + \sum_n V_{RC,c1}^n[k]\right) - \left(OCV_{c2}(z_{c2}[k]) + \sum_m V_{RC,c2}^m[k]\right) + I[k]R_{0,c1}}{R_{0,c1} + R_{0,c2}} \quad (7)$$

Equations (6) and (7) may be used for quantitatively determining the magnitudes of the currents which are, when the operating current I of the hybrid secondary battery flows, divided and flows to the first secondary battery and the second secondary battery.

Further, Equations (6) and (7) may be used for time-updating the state of charge $z_{c1}[k]$ of the first secondary battery and the state of charge $z_{c2}[k]$ of the second secondary battery, by using Equations (8) and (9) according to ampere counting method.

$$z_{c1}[k+1] = z_{c1}[k] + \frac{I_{c1}[k]}{Q_{c1}}\Delta t \quad (8)$$

$$z_{c2}[k+1] = z_{c2}[k] + \frac{I_{c2}[k]}{Q_{c2}}\Delta t \quad (9)$$

In Equations (8) and (9), $Q_{c1}$ and $Q_{c2}$ represent capacities of the first secondary battery and the second secondary battery, respectively. $\Delta t$ denotes time interval between time indices k and k+1.

In Equations (6) and (7), $OCV_{c1}(z_{c1}[k])$ and $OCV_{c2}(z_{c2}[k])$ may be determined by using open-circuit voltage profiles of the first secondary battery and the second secondary battery, and $$\sum_n V_{RC,c1}^n[k] \text{ and } \sum_m V_{RC,c2}^m[k]$$

may be determined by using Equation (1) and the first current $I_{c1}[k]$ and the second current $I_{c2}[k]$.

Meanwhile, in order for the control unit 130 to estimate the voltage of the hybrid secondary battery by using the equations expressed in a time-discrete equation described above, it is desirable to set initial conditions for the state of charge $z_{c1}[k]$ of the first secondary battery, the state of charge $z_{c2}[k]$ of the second secondary battery, voltage $$\sum_n V_{RC,c1}^n[k]$$

formed by at least one or more RC circuits included in the first circuit unit 210, and voltage $$\sum_m V_{RC,c2}^m[k]$$

formed by at least one or more RC circuits included in the second circuit unit 220.

In one embodiment, the control unit 130 may set the initial conditions as expressed by Equation (10) below, although the present disclosure is not necessarily limited thereto.

$$z_{c1}[0] = OCV_{c1}^{-1}(V[0])$$

$$z_{c2}[0] = OCV_{c2}^{-1}(V[0])$$

$V_{RC,c1}^n[0]=0$ ($n$ is sequence index of RC circuit)

$V_{RC,c2}^m[0]=0$ ($m$ is sequence index of RC circuit)  (10)

Referring to the initial conditions, V[0] is the operation initiating voltage of the hybrid secondary battery initially measured through the sensor unit 120 at the beginning of the charging or discharging of the hybrid secondary battery, and approximately, corresponds to the open-circuit voltage when the secondary battery begins charging or discharging. An operator $OCV_{c1}^{-1}$ is an inverse transform operator of $OCV_{c1}$ ($z_{c1}[k]$) which is the operator that transforms the state of charge of the first secondary battery into its corresponding open-circuit voltage, and an operator $OCV_{c2}^{-1}$ is an inverse transform operator of $OCV_{c2}(z_{c2}[k])$ which is the operator that transforms the state of charge of the second secondary battery into its corresponding open-circuit voltage. The result of calculation of the operators $OCV_{c1}^{-1}$ and $OCV_{c2}^{-1}$ may be determined by using the open-circuit voltage profiles of the first secondary battery and the second secondary battery that may be obtained in advance by experiments.

Figure 5:
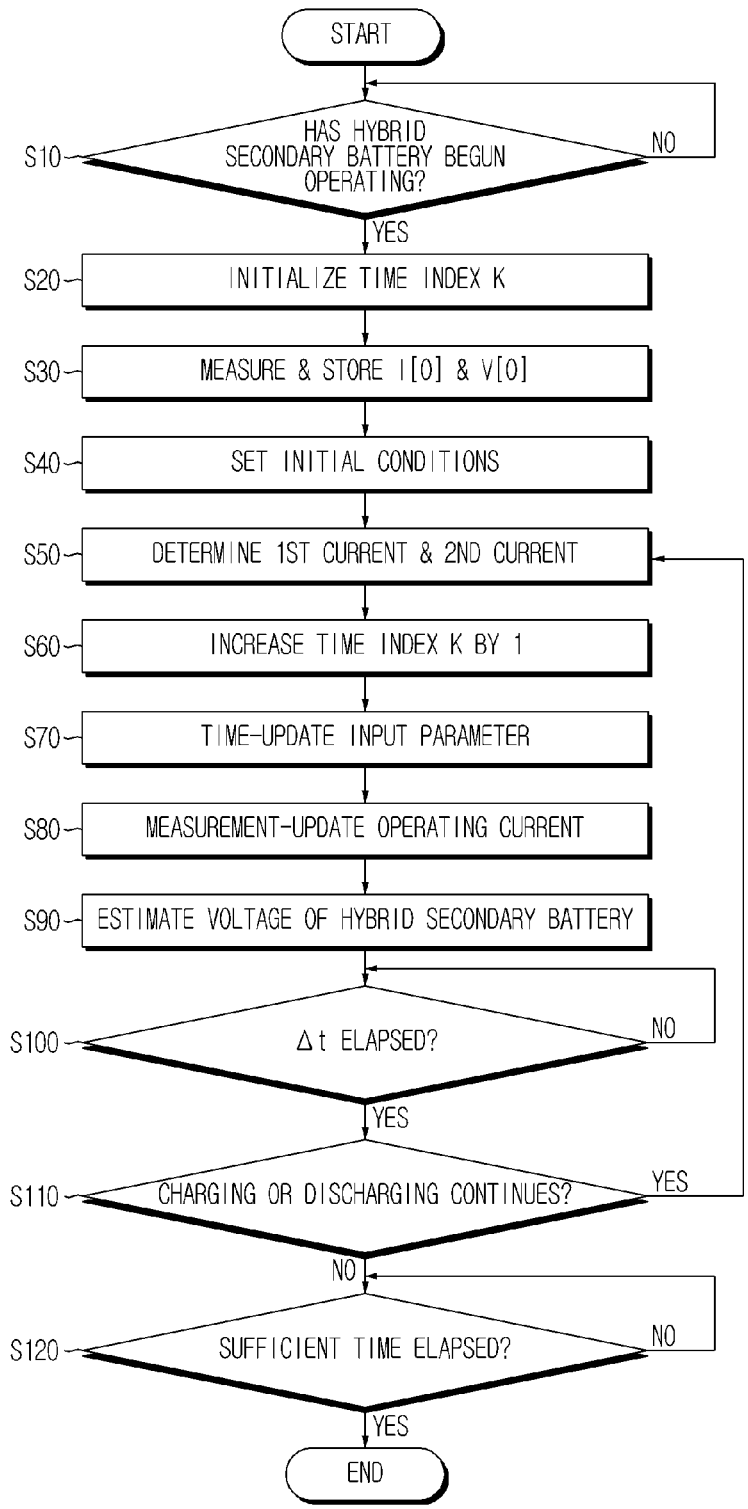
FIG. 5 is a flowchart sequentially illustrating a method for estimating a voltage of a hybrid secondary battery according to an embodiment of the present disclosure.

Hereinafter, referring to FIG. 5, a method of the control unit 130 estimating the voltage of a hybrid secondary battery at time intervals Δt, immediately after the onset of the hybrid secondary battery charging or discharging, will be described in detail.

First, at S10, by monitoring the direction and magnitude of the operating current flowing through the hybrid secondary battery 110 by using the sensor unit 120, the control unit 130 determines whether or not the operation (i.e., charging or discharging) of the hybrid secondary battery 110 has begun.

When determining that the operation of the secondary battery 110 has begun, at S20, the control unit 130 initializes a time index k to 0.

Next, at S30, the control unit 130 measures, through the sensor unit 120, V[0] corresponding to the operation initiating voltage of the secondary battery 110 and I[0] corresponding to operation initiating current, and stores the same in the storage unit 160.

After measuring and storing V[0] and I[0], at S40, the control unit 130 sets the initial conditions to estimate the voltage of the hybrid secondary battery as follows, by using the equations derived from the circuit model.

$$z_{c1}[0] = OCV_{c1}^{-1}(V[0])$$

$$z_{c2}[0] = OCV_{c2}^{-1}(V[0])$$

$V_{RC,c1}^n[0]=0$ ($n$ is sequence index of RC circuit)

$V_{RC,c2}^m[0]=0$ ($m$ is sequence index of RC circuit)

During the initial condition setting, the control unit 130 may refer to the electrical characteristic values of the respective circuit elements included in the first circuit unit 210 and the second circuit unit 220. To this purpose, the electrical characteristic values may preferably be stored at the storage unit 160 in advance. The electrical characteristic values of the respective circuit elements may be stored as fixed values, or alternatively, variable values. When the electrical characteristic values are stored as variable values, the electrical characteristic values may be varied according to the state of charge, temperature, capacity degradation, and so on, of the hybrid secondary battery.

Next, at S50, the control unit 130 determines the first current $I_{c1}[0]$ and the second current $I_{c2}[0]$ as below, by using the first current distribution equation (6) and the second current distribution equation (7). At this time, the initial conditions set at S40, the pre-defined open-circuit voltage profiles $OCV_{c1}[z_{c1}]$ and $OCV_{c2}[z_{c2}]$ of the first secondary battery and the second secondary battery, and the electrical characteristic values of the respective circuit elements included in the first circuit unit 210 and the second circuit unit 220, are used.

$$I_{c1}[0] = \frac{\left(\begin{array}{c} OCV_{c2}(z_{c2}[0]) + \\ \sum_m V_{RC,c2}^m[0] \end{array}\right) - \left(\begin{array}{c} OCV_{c1}(z_{c1}[0]) + \\ \sum_n V_{RC,c1}^n[0] \end{array}\right) + I[0]R_{0,c2}}{R_{0,c1} + R_{0,c2}}$$

$$I_{c2}[0] = \frac{\left(\begin{array}{c} OCV_{c1}(z_{c1}[0]) + \\ \sum_n V_{RC,c1}^n[0] \end{array}\right) - \left(\begin{array}{c} OCV_{c2}(z_{c2}[0]) + \\ \sum_m V_{RC,c2}^m[0] \end{array}\right) + I[0]R_{0,c1}}{R_{0,c1} + R_{0,c2}}$$

Next, at S60, the control unit 130 increments a time index k by 1. Next, at S70, by using the first current $I_{c1}[0]$ and the second current $I_{c2}[0]$ determined at S50, and Equations (1), (8) and (9), the control unit 130 performs time-update of the state of charge $z_{c1}$ of the first secondary battery, state of charge $z_{c2}$ of the second secondary battery, and voltages formed by the respective RC circuits included in the first circuit unit and the second circuit unit, as described below. Hereinafter, the four parameters as time-updated will be referred to as the 'input parameters'.

$$z_{c1}[1] = z_{c1}[0] + \frac{I_{c1}[0]}{Q_{c1}}\Delta t$$

$$z_{c2}[1] = z_{c2}[0] + \frac{I_{c2}[0]}{Q_{c2}}\Delta t$$

$$V_{RC,c1}^n[1] = \exp\left(-\frac{\Delta t}{R_{n,c1}C_{n,c1}}\right)V_{RC,c1}^n[0] + R_{n,c1}\left(1 - \exp\left(-\frac{\Delta t}{R_{n,c1}C_{n,c1}}\right)\right)I_{c1}[0]$$

($n = 1, 2, \ldots, p$)

$$V_{RC,c2}^m[1] = \exp\left(-\frac{\Delta t}{R_{m,c2}C_{m,c2}}\right)V_{RC,c2}^m[0] + R_{m,c2}\left(1 - \exp\left(-\frac{\Delta t}{R_{m,c2}C_{m,c2}}\right)\right)I_{c2}[0]$$

($m = 1, 2, \ldots, q$)

In the above equations, $R_{n,c1}$ and $C_{n,c1}$ respectively represent the resistance value and the capacitance value of the n-th RC circuit included in the first circuit unit. Similarly, $R_{m,c2}$ and $C_{m,c2}$ respectively represent the resistance value and the capacitance value of the m-th RC circuit included in the second circuit unit. n and m may be natural numbers equal to, or greater than 1. When the first circuit unit and/or the second circuit unit do not include an RC circuit, time-update of the voltage formed by the RC circuit may be omitted.

Next, at S80, the control unit 130 performs measurement update of the operating current, by measuring the operating current of the hybrid secondary battery through the sensor unit 120.

At S90, the control unit 130 then estimates the voltage of the hybrid secondary battery, by substituting the time-updated input parameters and the measurement-updated operating current into Equation (5) corresponding to the voltage equation, as follows.

$$V[1] = \frac{\left(OCV_{c1}(z_{c1}[1]) + \sum_n V_{RC,c1}^n[1]\right)R_{0,c2} + \left(OCV_{c2}(z_{c2}[1]) + \sum_m V_{RC,c2}^m[1]\right)R_{0,c1} + I[1]R_{0,c1}R_{0,c2}}{R_{0,c1} + R_{0,c2}} \quad (5)$$

In the above equation, $OCV_{c1}(z_{c1}[1])$ and $OCV_{c2}(z_{c2}[1])$ may be determined by using the pre-defined open-circuit voltage profiles of the first secondary battery and the second secondary battery. Further, $$\sum_n V_{RC,c1}^n[1] \text{ and } \sum_m V_{RC,c2}^m[1]$$

may be determined by using the time-updated RC circuit voltages. I[1] is the operating current measurement-updated by the sensor unit 120. The series resistance values $R_{0,c1}$, $R_{0,c2}$ of the first and the second circuit units are fixed or variable values which are pre-defined by experiments.

Upon completion of the voltage estimation using Equation (5), at S100, the control unit 130 determines whether or not the time-update interval for the input parameters, i.e., Δt, has elapsed.

When determining that time Δt has elapsed, at S110, the control unit 130 monitors the operating current of the secondary battery through the sensor unit 120 and determines whether charging or discharging of the secondary battery continues or not.

When determining that the secondary battery charging or discharging continues, the control unit 130 proceeds the process to S50 and accordingly, iterate once again the steps from the first current and the second current time-update to the hybrid secondary battery voltage estimation.

The iterative algorithm described above repeats every time the time update period Δt for the input parameters elapses, as long as the secondary battery charging or discharging continues.

Meanwhile, at S110, when determining that the secondary battery charging or discharging is substantially finished, at S120, the control unit 130 determines whether a sufficient time has elapsed since charging or discharging was finished.

The 'sufficient time' as used herein refers to the time consumed until the voltage of the hybrid secondary battery is stabilized to the voltage level corresponding to the open-circuit voltage.

When determining that the sufficient time has elapsed since charging or discharging was finished, the control unit 130 ends the voltage estimation process of the hybrid secondary battery using the circuit model.

The control unit 130 may store the results determined at each step into the storage unit 160, transmit to another external control unit, or display as a graphic interface through the display unit 150. The 'graphic interface' as used herein encompasses text, picture, graphic or a combination thereof.

Further, the control unit 130 may use the voltage of the hybrid secondary battery estimated by using the circuit model, for controlling charging or discharging of the secondary battery. Further, the control unit 130 may refer to the estimated voltage of the hybrid secondary battery, when determining the state of charge or capacity degradation of the secondary battery. In this case, the control unit 130 may be included as a part of a battery management system which controls overall operation of the secondary battery.

Alternatively, the control unit 130 may transmit the estimated voltage of the secondary battery to a control unit in charge of controlling the secondary battery. For example, for a hybrid secondary battery mounted to an electric vehicle or a hybrid electric vehicle, the control unit 130 may transmit the estimated voltage of the hybrid secondary battery to the central control unit of the vehicle.

In order to implement a variety of control logics including those described above, the control unit 130 may optionally include a known processor, application-specific integrated circuit (ASIC), other chipsets, logic circuit, register, communication modem, data processor, and so on. Further, when the control logics are implemented as a software, the control unit 130 may be implemented as a set of program modules. In this case, the program modules may be stored at a memory and executed by the processor. The memory may be internal or external to the processor and may be connected with the processor with a variety of known computer components. Further, the memory may be included in the storage unit 160 of the present disclosure. Further, the 'memory' collectively refers to any type of devices where information is stored, and is not intended to refer to any specific memory device.

Further, it is apparent that the control logics of the control unit 130 may construct a process of a method for estimating voltage of a hybrid secondary battery according to embodiments of the present disclosure.

Further, at least one or more of the control logics of the control unit 130 may be combined and the combined control logics may be written by a computer-readable code system and recorded on a computer-readable recording medium. The recording medium is not limited to any specific type, as long as it is accessible by a processor included in the computer. In one example, the recording medium may include at least one or more selected from the group consisting of ROM, RAM, register, CD-ROM, magnetic tape, hard disk, floppy disk, and optical data recording device. Further, the code system may be modulated into carrier signals and included in the communication carriers at a specific time point, and stored and executed in distributed network computers. Further, programmers in the technical field pertinent to the present disclosure will be easily able to envision functional programs, codes and code segments to implement the combined control logics.

EXAMPLES

First, a 30 Ah pouch-type, first lithium secondary battery including $Li[Ni_xMn_yCo_z]O_2$ and carbon material in the positive electrode and the negative electrode, respectively, and a 5 Ah pouch-type, second lithium secondary battery including $LiFePO_4$ and carbon material in the positive electrode and the negative electrode, respectively, were fabricated.

Next, the first lithium secondary battery and the second lithium secondary battery were connected in parallel to construct a hybrid secondary battery which was then loaded into a constant temperature chamber of a charging/discharging tester. Next, the hybrid secondary battery was discharged until the open-circuit voltage thereof becomes 3.7V with temperature maintained at 25° C., after which sufficient rest time followed. Next, the hybrid secondary battery was pulse-discharged for a short duration of several 10-seconds, under 200 A high rate discharge condition.

Figure 6:
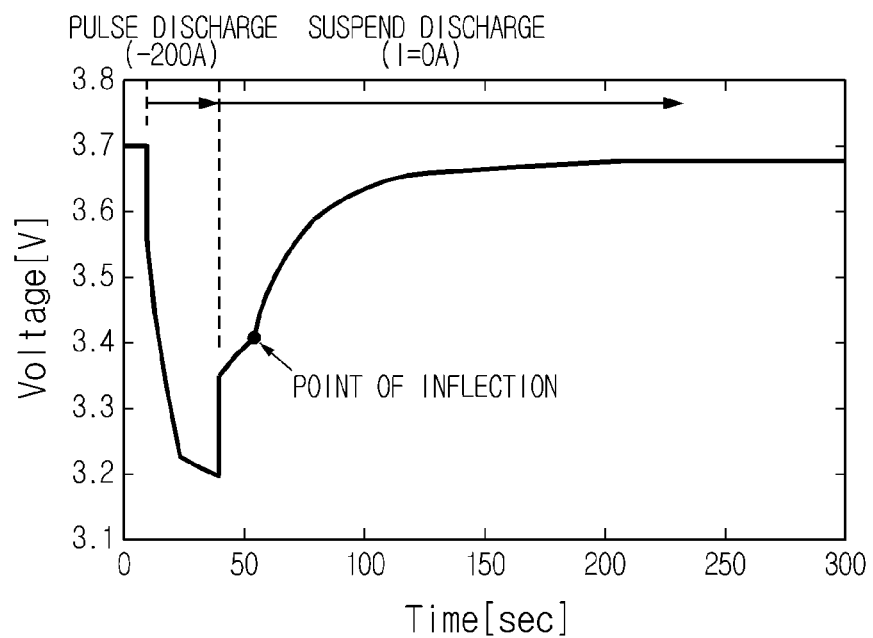
FIG. 6 is a graph illustrating a result of voltage estimation test conducted to verify an effect of a method for estimating a voltage of a hybrid secondary battery according to an embodiment of the present disclosure.

FIG. 6 is a graph representing the voltage of the hybrid secondary battery estimated during the pulse discharge test according to the present disclosure, as time passes.

Referring to FIG. 6, during the hybrid secondary battery pulse-discharge, it is noted that the estimated voltage profile is substantially identical to the voltage profile observed during actual pulse-discharge. Further, it is noted that the variation pattern of the voltage estimate, which was obtained immediately after the end of the pulse discharge, is converging toward the open-circuit voltage in a substantially same pattern as the variation pattern observed in the actual voltage of the hybrid secondary battery. Further, the actual voltage variation of the hybrid secondary battery fabricated according to the Example is observed to have a point of inflection appearing after the end of pulse discharge, and the estimated voltage profile is also observed to have the point of inflection. These test results indicate that the circuit model according to the present disclosure can simulate the voltage of the hybrid secondary battery with reliability, and particularly, can simulate the voltage of the hybrid secondary battery with reliability and validity, even when the voltage variation profile has a point of inflection.

The present disclosure has been described in detail. However, it should be understood that the detailed description and specific examples, while indicating preferred embodiments of the disclosure, are given by way of illustration only and various changes and modifications within the scope of the disclosure will become apparent to those skilled in the art from this detailed description.

| [Description of reference numerals] | |
| --- | --- |
| 100: apparatus for estimating voltage of hybrid secondary battery | |
| 110: hybrid secondary battery | 120: sensor unit |
| 130: control unit | 140: load |
| 150: display unit | 160: storage unit |

What is claimed is:

1. An apparatus for estimating voltage of a hybrid secondary battery, wherein the hybrid secondary battery comprises a first secondary battery and a second secondary battery having different electrochemical characteristics from each other and being connected in parallel with each other, the apparatus comprising:

a sensor including a sense resistor configured to measure an operating current of the hybrid secondary battery; and a battery management system including a processor and a memory, wherein the battery management system is electrically coupled to the hybrid secondary battery and wherein the battery management system is configured to estimate the voltage of the hybrid secondary battery using the operating current, and a voltage equation derived from a circuit model stored in the memory of the battery management system, the circuit model comprising a first circuit unit configured to simulate a voltage variation of the first secondary battery by a first open-circuit voltage element and optionally, a first impedance element, and a second circuit unit connected in parallel with the first circuit unit and configured to simulate a voltage variation of the second secondary battery by a second open-circuit voltage element and optionally, a second impedance element, wherein the battery management system is configured to initiate charging and discharging of the hybrid secondary battery based on the estimated voltage, wherein the voltage equation is described by the following expression:

$$V[k] = \frac{\left(OCV_{c1}(z_{c1}[k]) + \sum_n V_{RC,c1}^n[k]\right)R_{0,c2} + \left(OCV_{c2}(z_{c2}[k]) + \sum_m V_{RC,c2}^m[k]\right)R_{0,c1} + I[k]R_{0,c1}R_{0,c2}}{R_{0,c1} + R_{0,c2}},$$

and wherein V [k] denotes the voltage of the hybrid secondary battery, $OCV_{c1}(z_{c1}[k])$ denotes a first open-circuit voltage of the first open-circuit voltage element, $OCV_{c2}(z_{c2}[k])$ denotes the second open-circuit voltage of the second open-circuit voltage element, $$\sum_n V_{RC,c1}^n[k]$$

denotes a sum of voltages formed by at least one or more RC circuits $RC_{n,c1}$ included in the first circuit unit, $$\sum_m V_{RC,c2}^m[k]$$

denotes a sum of voltages formed by at least one or more RC circuits $RC_{m,c2}$ included in the second circuit unit, and $R_{0,c1}$ and $R_{0,c2}$ denote resistance values of series resistors included in the first circuit unit and the second circuit unit, respectively.

2. The apparatus of claim 1, wherein the first secondary battery and the second secondary battery are packaged in different packages from each other as independent batteries, or packaged together in a single package.

3. The apparatus of claim 1, wherein at least one of the first secondary battery and the second secondary battery includes a plurality of unit cells or a plurality of battery modules.

4. The apparatus of claim 2, wherein at least one of the first secondary battery and the second secondary battery includes a plurality of unit cells or a plurality of battery modules.

5. The apparatus of claim 1, wherein the control unit:
determines a first open-circuit voltage formed by the first open-circuit voltage element, based on a pre-defined first correlation between a first state of charge of the first secondary battery and the first open-circuit voltage, and
determines a second open-circuit voltage formed by the second open-circuit voltage element, based on a pre-defined second correlation between a second state of charge of the second secondary battery and the second open-circuit voltage.

6. The apparatus of claim 5, wherein the first correlation is a look-up table or a look-up function obtained from an open-circuit voltage profile according to state of charge variation of the first secondary battery, and
the second correlation is a look-up table or a look-up function obtained from an open-circuit voltage profile according to state of charge variation of the second secondary battery.

7. The apparatus of claim 1, wherein the first impedance element and the second impedance element includes at least one resistor, at least one capacitor, at least one inductor, or a combination thereof.

8. The apparatus of claim 7, wherein the first impedance element and the second impedance element includes at least one RC circuit in which a resistor and a capacitor are connected in parallel, and a resistor connected in series thereto.

9. The apparatus of claim 1, wherein the first open-circuit voltage element and the first impedance element are connected in series with each other, and
wherein the second open-circuit voltage element and the second impedance element are connected in series with each other.

10. The apparatus of claim 1, wherein the control unit:
determines a first impedance voltage formed by the first impedance element, by using a first impedance voltage equation derived from a connection relation and electrical characteristic values of circuit elements included in the first impedance element, and
determines a second impedance voltage formed by the second impedance element, by using a second impedance voltage equation derived from a connection relation and electrical characteristic values of circuit elements included in the second impedance element.

11. The apparatus of claim 1, wherein the control unit:
determines, from the circuit model, a first current and a second current flowing through the first circuit unit and the second circuit unit, respectively,
time-updates a first state of charge of the first secondary battery and a second state of charge of the second secondary battery, by adding up the first current and the second current, respectively,
time-updates a first impedance voltage formed by the first impedance element and a second impedance voltage formed by the second impedance element, by using the time-updated first state of charge and the time-updated second state of charge, and the first current and the second current,
determines a first open-circuit voltage of the first secondary battery and a second open-circuit voltage of the second secondary battery corresponding to the time-updated first state of charge and the time-updated second state of charge, and
estimates the voltage of the hybrid secondary battery by substituting the determined first open-circuit voltage and the determined second open-circuit voltage, the time-updated first impedance voltage and the time-updated second impedance voltage, and the measured operating current, into the voltage equation.

12. An electrically-driven apparatus comprising the apparatus as defined in claim 1.

13. A method for estimating voltage of a hybrid secondary battery comprising a first secondary battery and a second secondary battery having different electrochemical characteristics from each other and being connected in parallel with each other, the method comprising:
providing a battery management system electrically coupled to the hybrid secondary battery and including a processor and a memory, the memory including a circuit model comprising a first circuit unit configured to simulate a voltage variation of the first secondary battery by a first open-circuit voltage element and optionally, a first impedance element, and a second circuit unit connected in parallel with the first circuit unit and configured to simulate a voltage variation of the second secondary battery by a second open-circuit voltage element and optionally, a second impedance element;
measuring an operating current of the hybrid secondary battery;
determining, from the circuit model, a first current and a second current flowing through the first circuit unit and the second circuit unit, respectively;
time-updating a first state of charge of the first secondary battery and a second state of charge of the second secondary battery, by adding up the determined first current and the determined second current, respectively;
time-updating a first impedance voltage formed by the first impedance element and a second impedance voltage formed by the second impedance element, by using the time-updated first state of charge and the time-updated second state of charge, and the first current and the second current;
determining a first open-circuit voltage of the first secondary battery and a second open-circuit voltage of the second secondary battery corresponding to the time-updated first state of charge and the time-updated second state of charge, respectively; and
estimating the voltage of the hybrid secondary battery by substituting the determined first open-circuit voltage and the determined second open-circuit voltage, the time-updated first impedance voltage and the time-updated second impedance voltage, and the measured operating current, into a voltage equation derived from the circuit model; and
initiating, via the battery management system, the charging and discharging of the hybrid secondary battery based on the estimated voltage,
wherein the voltage equation is described by the following expression:

$$V[k] = \frac{\left(OCV_{c1}(z_{c1}[k]) + \sum_n V_{RC,c1}^n[k]\right)R_{0,c2} + \left(OCV_{c2}(z_{c2}[k]) + \sum_m V_{RC,c2}^m[k]\right)R_{0,c1} + I[k]R_{0,c1}R_{0,c2}}{R_{0,c1} + R_{0,c2}},$$

and wherein $V[k]$ denotes the voltage of the hybrid secondary battery, $OCV_{c1}(z_{c1}[k])$ denotes a first open-circuit voltage of the first open-circuit voltage element, $OCV_{c2}(z_{c2}[k])$ denotes the second open-circuit voltage of the second open-circuit voltage element, $$\sum_n V_{RC,c1}^n[k]$$

denotes a sum of voltages formed by at least one or more RC circuits $RC_{n,c1}$ included in the first circuit unit, $$\sum_m V_{RC,c2}^m[k]$$

denotes a sum of voltages formed by at least one or more RC circuits $RC_{m,c2}$ included in the second circuit unit, and $R_{0,c1}$ and $R_{0,c2}$ denote resistance values of series resistors included in the first circuit unit and the second circuit unit, respectively.

14. The method according to claim 13, further including measuring an operation initiating voltage of the hybrid secondary battery; and
determining initial conditions for the state of charge of the first secondary battery and the state of charge of the second secondary battery based on the states of charge corresponding to the operation initiating voltage.

15. The method according to claim 13, further including determining initial conditions for the first impedance voltage and the second impedance voltage.

16. The method according to claim 13, wherein the first current and the second current are respectively determined based on a first current distribution equation and a second current distribution equation, wherein the first and the second current distribution equations include input parameters including the first open-circuit voltage and the second open-circuit voltage, the first impedance voltage and the second impedance voltage, and the operating current.

17. A non-transitory computer-readable recording medium recording therein a program for implementing the method as defined in claim 13.

* * * * *